(12) United States Patent
Chen et al.

(10) Patent No.: US 9,048,341 B2
(45) Date of Patent: Jun. 2, 2015

(54) INTEGRATED CIRCUIT CAPACITOR AND METHOD

(75) Inventors: Shih-Hung Chen, Jhudong Township, Hsinchu County (TW); Kuang-Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 371 days.

(21) Appl. No.: 13/451,428

(22) Filed: Apr. 19, 2012

(65) Prior Publication Data

US 2013/0277799 A1    Oct. 24, 2013

(51) Int. Cl.
*H01L 21/02* (2006.01)
*H01L 49/02* (2006.01)

(52) U.S. Cl.
CPC ...................................... *H01L 28/91* (2013.01)

(58) Field of Classification Search
USPC .............. 257/295, 306, 532, 758; 438/3, 253, 438/255, 26, 382, 396, 618, 386
See application file for complete search history.

(56) References Cited

U.S. PATENT DOCUMENTS

| 5,218,471 | A | 6/1993 | Swanson et al. | |
|---|---|---|---|---|
| 5,497,016 | A | 3/1996 | Koh | |
| 6,222,246 | B1 * | 4/2001 | Mak et al. | 257/532 |
| 6,340,622 | B1 * | 1/2002 | Lee et al. | 438/396 |
| 7,851,849 | B2 | 12/2010 | Kiyotoshi | |
| 8,236,645 | B1 * | 8/2012 | Chumakov | 438/255 |
| 8,383,512 | B2 | 2/2013 | Chen et al. | |
| 2002/0106823 | A1 | 8/2002 | Hwang et al. | |
| 2003/0064295 | A1 | 4/2003 | Yasuyuki et al. | |
| 2005/0239219 | A1 * | 10/2005 | Moon | 438/3 |
| 2008/0073635 | A1 | 3/2008 | Kiyotoshi et al. | |
| 2009/0310415 | A1 | 12/2009 | Jin et al. | |
| 2011/0018051 | A1 | 1/2011 | Kim et al. | |
| 2012/0168841 | A1 | 7/2012 | Chen et al. | |
| 2012/0184097 | A1 | 7/2012 | Chen et al. | |
| 2013/0130468 | A1 * | 5/2013 | Higashitani et al. | 438/382 |

OTHER PUBLICATIONS

Xie P. et al., "Analysis of Higher-Order Pitch Division for Sub-32nm Lithography," Optical Microlithography XXII, Proc. SPIE vol. 7274, Mar. 2009, 8 pp.

* cited by examiner

*Primary Examiner* — Errol Fernandes
(74) *Attorney, Agent, or Firm* — Haynes Beffel & Wolfeld LLP; James F. Hann

(57) ABSTRACT

An example of a capacitor includes a series of ridges and trenches and an interconnect region on the integrated circuit substrate. The series of ridges and trenches and the interconnect region have a capacitor foundation surface with a serpentine cross-sectional shape on the series of ridges and trenches. Electrical conductors are electrically connected to the electrode layers from the interconnect region for access to the electrode layers of the capacitor assembly.

11 Claims, 16 Drawing Sheets

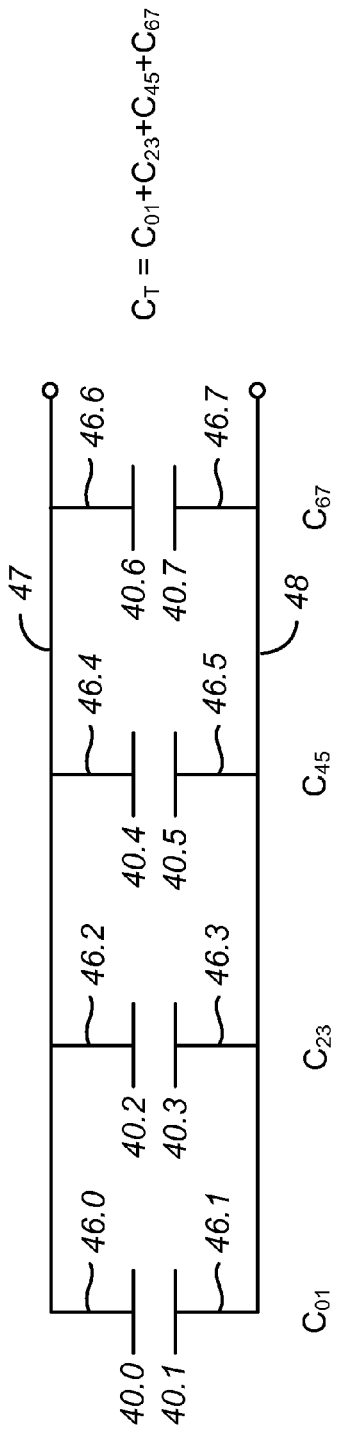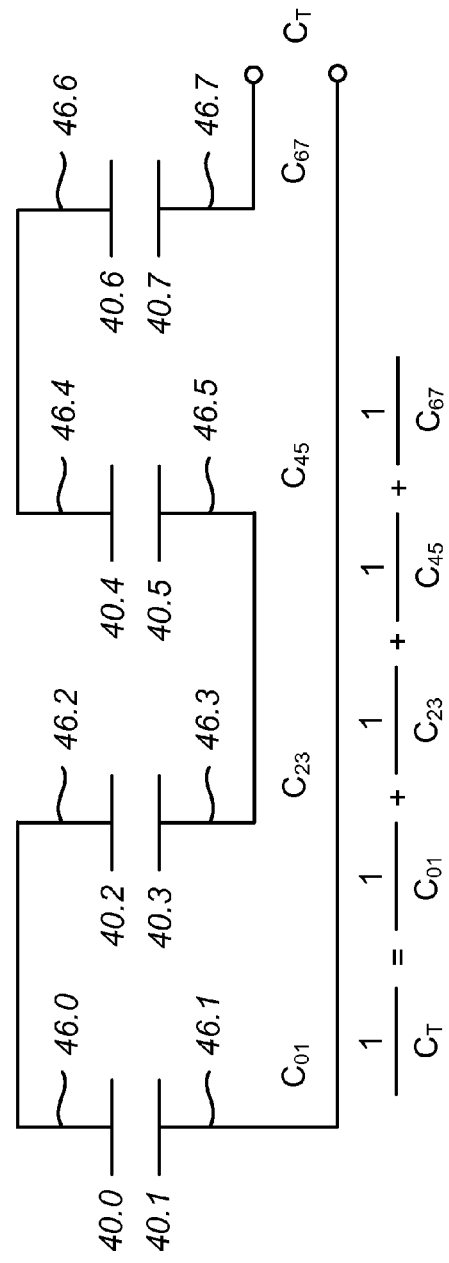

_____

INTEGRATED CIRCUIT CAPACITOR AND METHOD

CROSS-REFERENCE TO OTHER APPLICATIONS

This application is related to the following U.S. patent applications: U.S. patent application Ser. No. 13/049,303, filed 16 Mar. 2011, entitled REDUCED NUMBER OF MASK FOR IC DEVICE WITH STACKED CONTACT LEVELS (now U.S. Pat. No. 8,598,032); and U.S. patent application Ser. No. 13/114,931, filed 24 May 2011, entitled MULTILAYER CONNECTION STRUCTURE AND MAKING METHOD (now U.S. Pat. No. 8,383,512).

BACKGROUND OF THE INVENTION

Capacitors are electronic devices including two electrodes separated by insulating material. When there is a voltage difference between the two electrodes, an electric field is created between the two electrodes thereby storing electrical energy. The amount of electrical energy that can be stored on a capacitor for a given voltage across the electrodes is referred to as capacitance. Electrodes are typically in the form of plates of various shapes, surface contours and sizes. The capacitance is generally a function of the dielectric constant κ of the dielectric layer, directly proportional to the area of the opposed electrodes and inversely proportional to the distance between the electrodes. Placing two or more capacitors in parallel results in a total capacitance of the combination to be equal to the sum of the individual capacitors. Placing two or more capacitors in series results in a total capacitance of the combination to be less than the capacitance of any the individual capacitors. Series connected capacitors are commonly used in high-voltage situations because the high-voltage is divided among the capacitors. While providing capacitors of various sizes is usually not a problem outside of an integrated circuit, conventional integrated circuits are limited to relatively small capacitors because of size limitations. See, for example, U.S. Pat. No. 5,497,016.

BRIEF SUMMARY OF THE INVENTION

An example of a capacitor comprises a series of ridges and trenches, and an interconnect region, a serpentine, stacked plate capacitor assembly, and electrical conductors. The series of ridges and trenches and the interconnect region being on a substrate and having a capacitor foundation surface with a serpentine cross-sectional shape on the series of ridges and trenches. The serpentine, stacked plate capacitor assembly, which includes at least two electrically conductive electrode layers and dielectric layers separating the electrode layers, is at the capacitor foundation surface to create a stack of one or more capacitors. The electrical conductors are electrically connected to the electrode layers from the interconnect region for access to the electrode layers of the capacitor assembly. Some examples of the capacitor may include one or more of the following. The capacitor foundation surface may be electrically conductive and constitute an electrode layer. The interconnect region may be spaced apart from the series of ridges and trenches. The interconnect region may be at least one of the ridges or trenches. The electrical conductors may pass through vertical vias in the interconnect region, the vertical vias overlying landing pads of the electrode layers with the electrical conductors electrically connected to the landing pads. The landing pads to which the electrical conductors are electrically connected may be arranged in a stair stepped arrangement. The series of ridges may be located above and extend away from the substrate. The series of ridges may also be located within a trench in the substrate.

An example of a method for forming a capacitor may be carried out as follows. A series of ridges separated by trenches are formed on a substrate. An interconnect region is also formed on the substrate adjacent to the series of ridges and trenches. The series of ridges and trenches and the interconnect region have a capacitor foundation surface. The ridges forming step is carried out so that the capacitor foundation surface has convex and concave structures defining a serpentine cross-sectional shape. Alternating layers of electrically conductive electrode layers and dielectric layers separating the electrode layers are formed on the capacitor foundation surface to create a stack of at least two serpentine plate capacitors. Electrical conductors are electrically connected to the electrode layers at the interconnect region for access to the electrode layers. Some examples of the capacitor forming method may include one or more of the following. The ridges forming step may be carried out by forming the series of dielectric ridges within a trench in the substrate. The electrically connecting step may comprise: removing material from a part of the interconnect region, the material covering landing pads of the electrode layers; depositing a dielectric material in said part of the interconnect region; forming vias through the interconnect region to the landing pads; and forming electrical conductors in the vias and electrically coupling the electrical conductors to the landing pads. The electrically connecting step may also comprise creating a stair step arrangement of the landing pads to which the electrical conductors are electrically connected. The electrically connecting step may comprise using a set of N etch masks for creating up to and including $2^N$ levels of landing pads at the interconnect region, each mask comprising mask and etch regions, N being an integer equal to at least 2, x being a sequence number starting at x=0 for the masks, so that for one mask x=0, for another mask x=1, and so forth through x=N−1; etching the interconnect region N times using said masks in a chosen order to create contact openings extending to each electrode layer; and the etching step may comprise etching through $2^x$ electrode layers for each mask of sequence number x. Each etch mask may alternatingly cover $2^x$ mask regions and exposes $2^x$ etch regions so that the photoresist mask with x=0 alternatingly covers $2^0$ landing pads and exposes $2^0$ landing pads, the photoresist mask with x=1 alternatingly covers $2^1$ landing pads and exposes $2^1$ landing pads, and the photoresist mask with x=2 alternatingly covers $2^2$ landing pads and exposes $2^2$ landing pads. The alternating layers forming step may be carried out to form a stack of at least four serpentine plate capacitors. The dielectric ridges forming step may be carried out so that the ridges have ridge heights, ridge widths and trench widths. The dielectric ridges forming step may be carried out so that the range of the ratios of an average of the ridge heights to an average of the ridge widths is 3-20.

Other features, aspects and advantages of the present invention can be seen on review the figures, the detailed description, and the claims which follow.

BRIEF DESCRIPTION OF THE DRAWINGS

FIG. 10 schematically illustrates connecting the capacitors in parallel to create a large-capacitance capacitor.

FIG. 11 schematically illustrates connecting the capacitors in series.

DETAILED DESCRIPTION OF THE INVENTION

Figure 1:
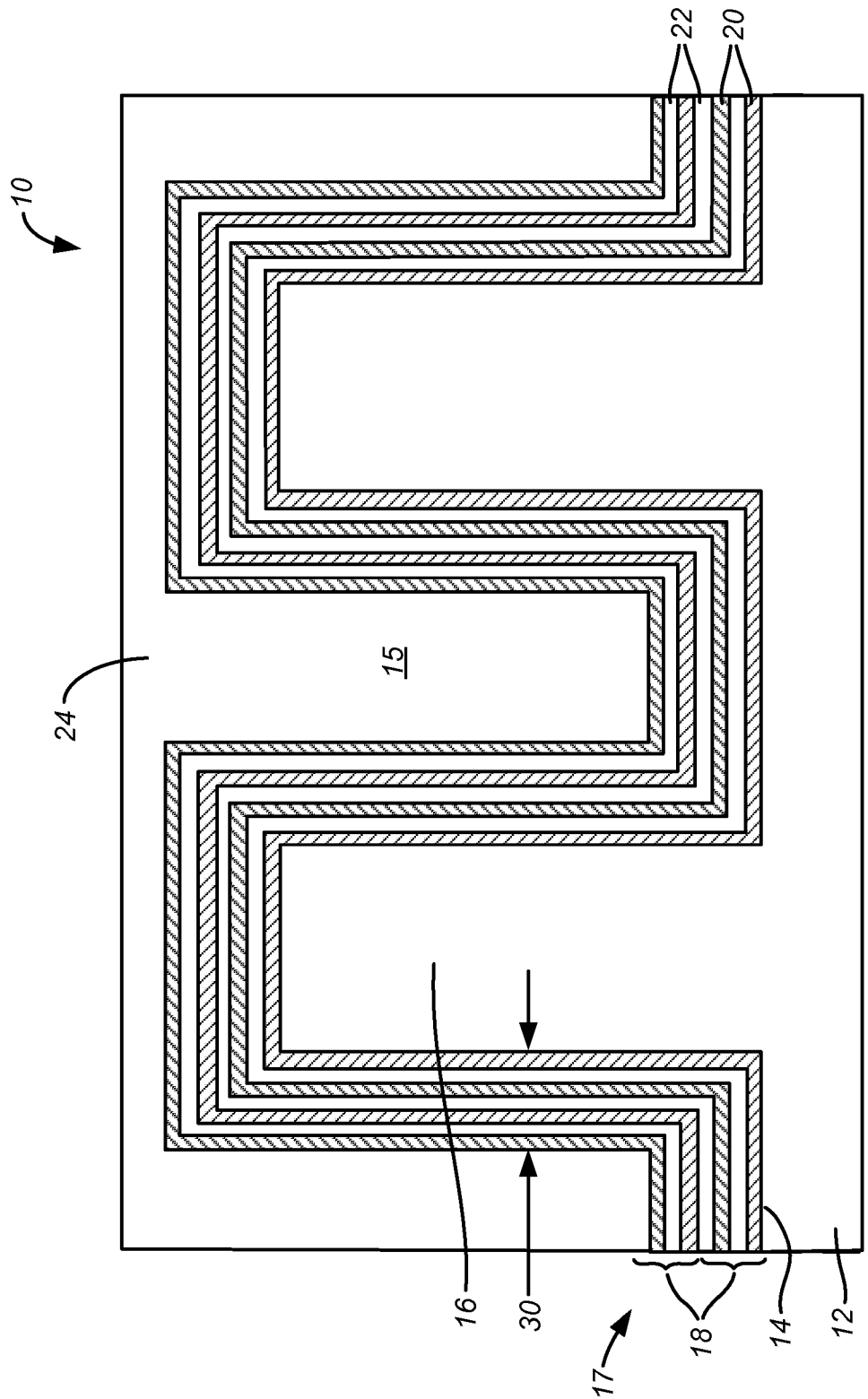
FIG. 1 is a simplified cross-sectional view of one example of an integrated circuit capacitor.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

It is widely recognized that capacitance is very useful in electronic circuitry, but is expensive and has manufacturing difficulties when manufactured in semiconductors. Capacitance can be used to help reduce voltage variations and can be used to help save data in memory, such as SRAM, DRAM and Flash, either during normal operations or due to unexpected power failures. While there are system-level products for providing such capacitance, there may be advantages to providing it at the semiconductor level, including system cost, power and reliability.

FIG. 1 illustrates an integrated circuit capacitor 10, integrated circuit capacitor 10 typically being a portion of an integrated circuit. Integrated circuit capacitor 10 can provide an integrated circuit with low-cost, high density capacitance. Integrated circuit capacitor 10 includes a substrate 12, the upper portion of substrate 12 having a substrate surface 14 from which ridges 16 extend, ridges 16 being separated by trenches 15. While ridges 16 and the upper portion of substrate 12 are typically made of the same material, they could also be made of different materials. In some examples, as in the examples of FIGS. 1-12, the ridges 16 are formed within a trench formed within the upper portion of substrate 12 while in other examples ridges 16 are formed on top of the upper portion of substrate 12. In the example of FIG. 1, ridges 16 and the upper portion of substrate 12 are made of the same dielectric material. To simplify nomenclature in this application, the upper portion of substrate 12 will commonly be referred to as substrate 12.

As discussed below, in other examples, ridges 16 can be made of semiconductor or conductor materials provided that the conductive ridges are isolated in some way from the IC bulk substrate below the upper portion of substrate 12 immediately below ridges 16. In such examples, the ridges 16 and the upper portions of substrate 12 would act as an electrically conductive electrode layer 20. Methods for making ridges 16 can include patterned etch processes based on photolithography, and other technologies. The particular method for making ridges 16 separated by trenches 15 may depend on several considerations such as the materials chosen, the depth of trenches, ratio of width to height of trenches, etc. One way to reduce the pitch between ridges 16 below that of the minimum pitch produced lithographically is through the use of double or quadruple patterning, sometimes referred to as multiple patterning. Through this method a single mask is typically used to create a series of parallel lines of material on the substrate. Different methods can then be used to transform each parallel line of material into multiple parallel lines of material. The various methods typically use a series of deposition and etching steps to do so. Different methods are discussed in Xie, Peng and Smith, Bruce W., *Analysis of Higher-Order Pitch Division for Sub-32 nm Lithography*, Optical Microlithography XXII, Proc. of SPIE Vol. 7274, 72741Y, © 2009 SPIE. Multiple patterning methods are also described in U.S. patent application Ser. No. 12/981,121, filed 29 Dec. 2010, entitled MULTIPLE PATTERNING METHOD, having a common assignee and a common inventor with this application.

As illustrated in FIG. 1, a stack 17 of serpentine plate capacitors 18 is formed on substrate 12 and dielectric ridges 16 to follow a serpentine path having concave portions and convex portions. Stack 17 includes first and second serpentine plate capacitors 18, each serpentine plate capacitor including a pair of electrically conductive electrode layers 20 with dielectric layers 22 separating the electrode layers. In practice, one or more, such as 4 to 8 or more, serpentine plate capacitors 18 can be used. Also, more than two ridges 16, such as a thousand or more, can be used. However, only two of each are shown for clarity of illustration. Stack 17 is covered with a dielectric fill layer 24.

In the examples of FIGS. 1-9, ridges 16 and the upper portion of substrate 12 are dielectric materials. Using silicon oxide materials for ridges 16 may be preferred because of the extensive experience in the industry with these materials. Also, other dielectrics can be used, including low dielectric constant (low-k) materials such as silicon nitride or other low-k dielectrics. In some examples, the capacitor structures can be made on what could be called a rough surface conductor so that the upper portion of substrate 12 and ridges 16 would be made of electrical conductors and thus act as an electrically conductive electrode layer. In general, the conductors can be a metal or combination of metals, include Al, Cu, W, Ti, Co, Ni. The conductors can also be metal compounds, such as TiN/TaN/AlCu, or semiconductor compounds, such as heavily doped Si (using dopants such as As, P, B.); silicides including TiSi, CoSi. Also, typical dielectric materials include $SiO_2$, SiN, SiON. However, high dielectric constant (high-k) materials having a dielectric constant greater than that of silicon dioxide, such as $HfO_x$, HfON, $AlO_x$, $RuO_x$, $TiO_x$, are generally preferred. The dielectric materials may also be a multi-layer, such as silicon oxide/silicon nitride, silicon oxide (ONO), silicon oxide, high-k dielectric, silicon oxide (O/high-k/O), which provide higher k values and create less concern about capacitance leakage.

Figure 2:
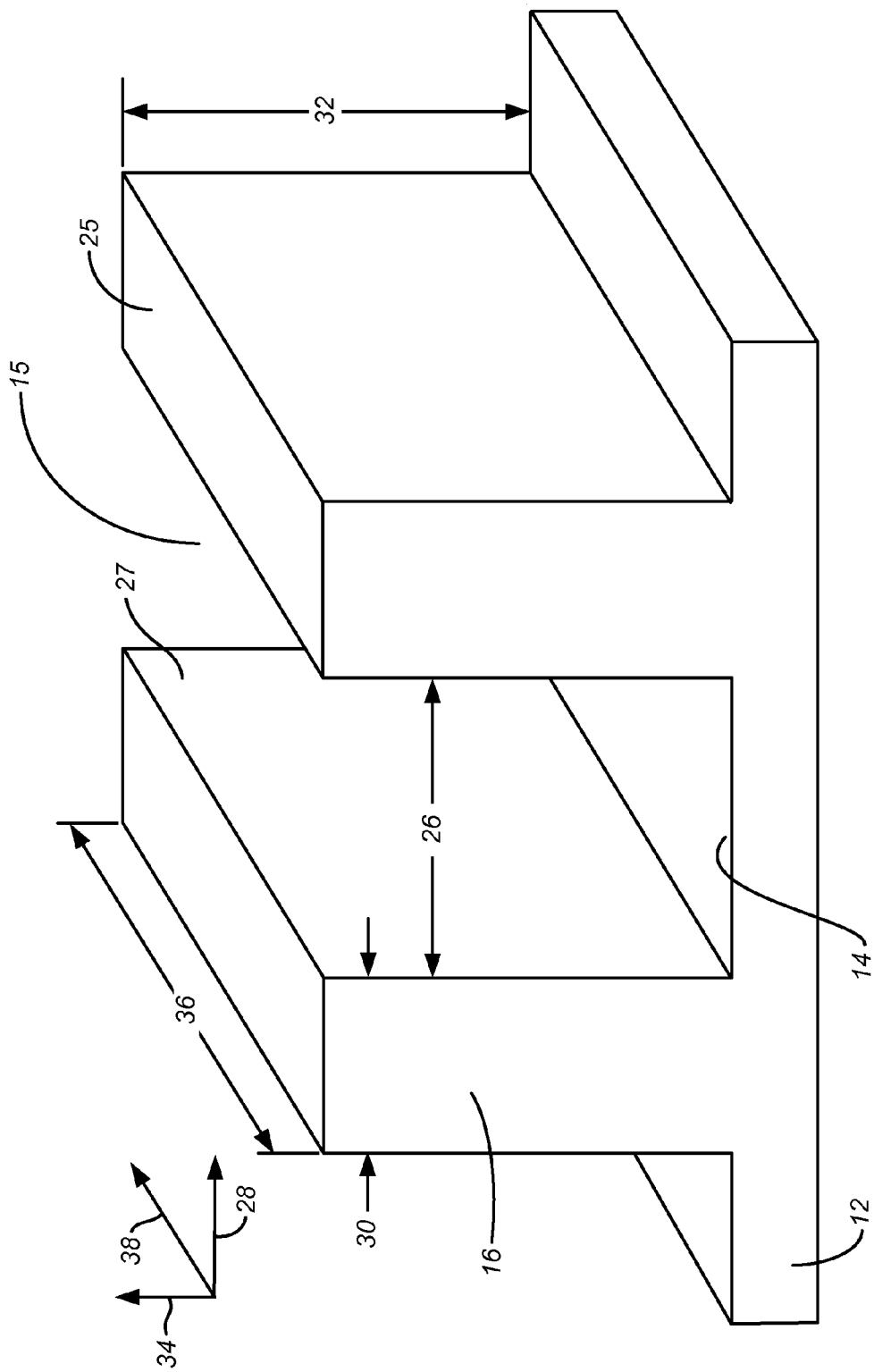
FIG. 2 is a simplified three-dimensional view illustrating dielectric ridges extending upwardly away from a substrate in the integrated circuit capacitor of FIG. 1.

FIG. 2 is a simplified three-dimensional view illustrating dielectric ridges 16 extending upwardly away from substrate surface 14 of substrate 12 and separated by trenches 15. Ridges 16 have top wall surfaces 25 and sidewall surfaces 27. Ridges 16 are separated by trench widths 26 extending in a first direction 28. The number of electrode layers 20 and dielectric layers 22 is largely determined by the size of trench width 26. Ridges 16 have a ridge width 30 extending in the first direction 28 and a ridge height 32 extending in a second direction 34. Ridges 16 have a ridge length 36 extending in a third direction 38. First, second and third directions 28, 34 and 38 are typically perpendicular to one another. When IC catheter 10 is formed in a trench, ridge height 32 will typically be about equal to the depth of the trench. The ratio of an average of the ridge heights 32 to an average of the ridge widths 30 is preferably large, such as 100, to increase the total capacitance per unit area. A ratio of average ridge heights 32 to average ridge widths 30, using current technology, would be in the range of 3-20. Trench width 26 needs to be more than twice the thickness 39, see FIG. 1, of stack 17.

Figure 3:
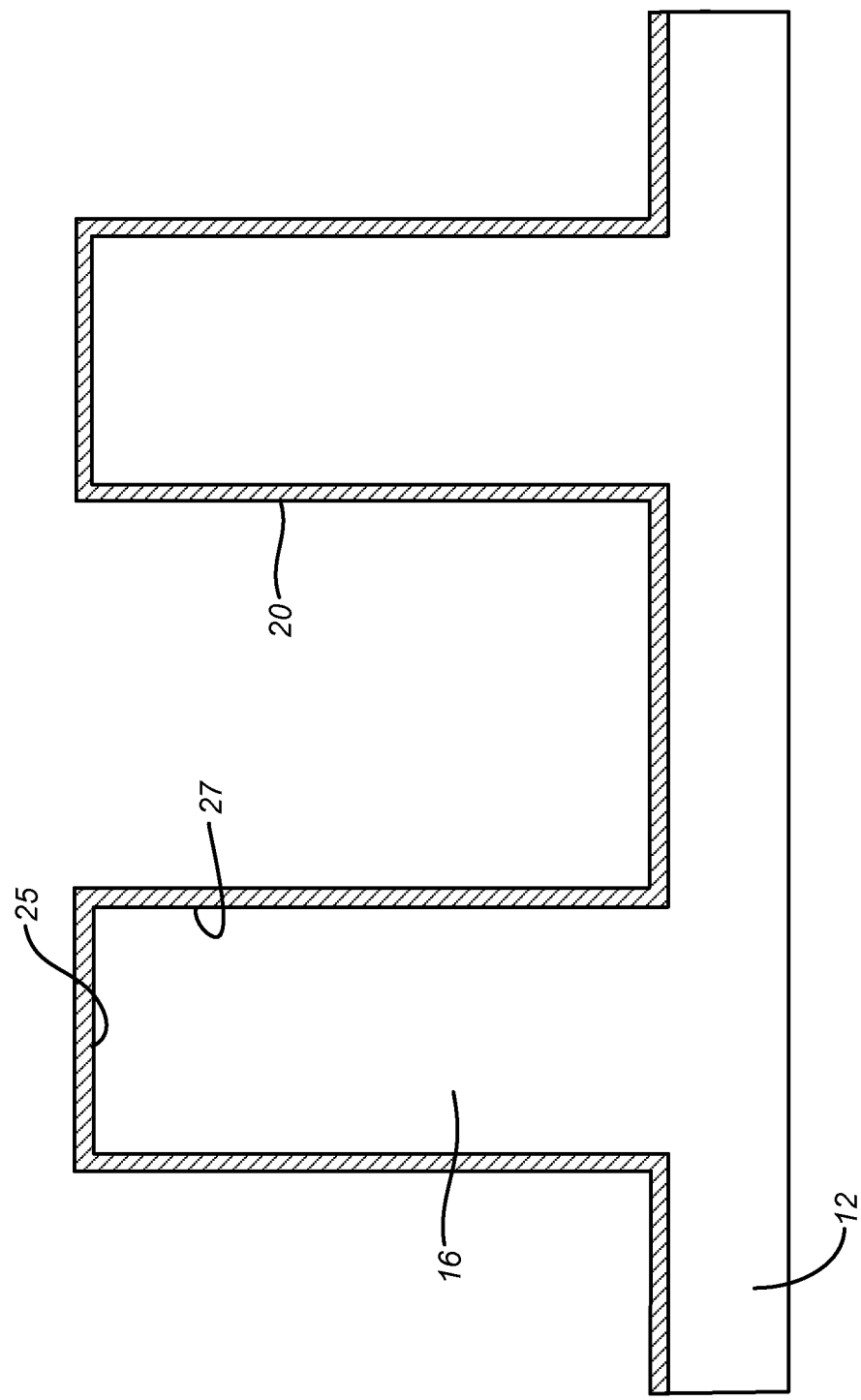
FIG. 3 is a simplified cross-sectional view of the structure of FIG. 2 after the deposition of an electrode layer on the dielectric ridges and the exposed surface of the substrate, the electrode layer having a serpentine cross-sectional shape forming concave and convex structures.
Figure 4:
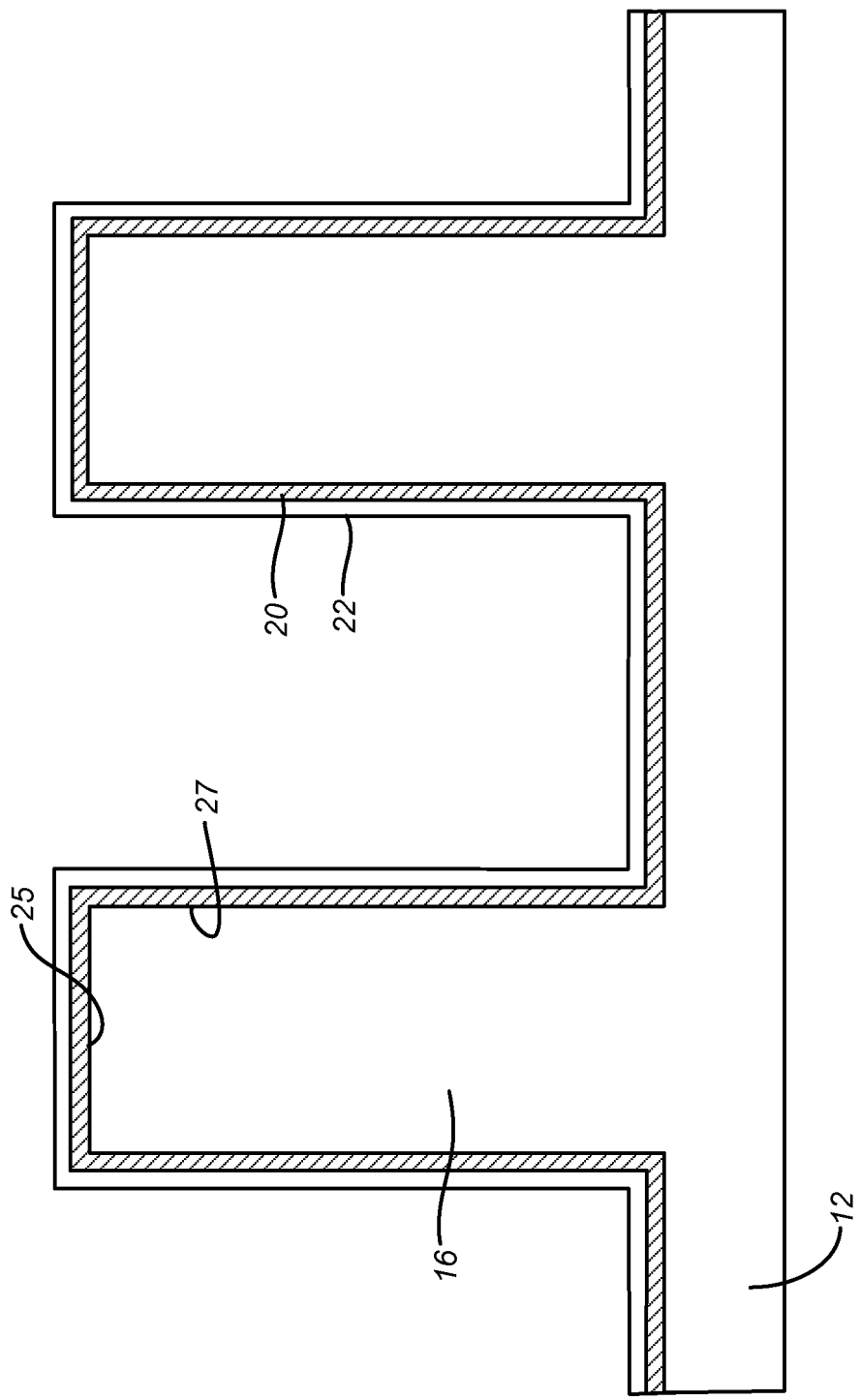
FIG. 4 shows the structure of FIG. 3 after the deposition of a dielectric layer on the electrode layer.

FIG. 3 shows the structure of FIG. 2 after the conformal deposition of an electrode layer 20 on top wall surfaces 25 and sidewall surfaces 27 of dielectric ridges 16 and the exposed substrate surface 14. Electrode layer 20 is typically made of a metal or other electrical conductor. FIG. 4 shows the structure of FIG. 3 after the conformal deposition of a dielectric layer 22 on the electrode layer 20. A preferred average thickness for electrode layer 20 is 10-100 nm and for dielectric layer 22 is also 10-100 nm based on yield concerns. A minimum thickness for each is considered to be greater than 3 nm based on direct tunneling leakage current concerns for dielectric layer 22 and conducting concerns for electrode layer 20. The dielectric layer 22 needs to be thick enough to prevent Fowler Nordheim (FN) tunneling issues characterized by the following equation. $V/t < 6$ megavolts/cm where V is operation voltage, t is dielectric thickness. For example, if $V=3$ volts, $t > 3V/(6*10^6 V/cm) = \rightarrow t > 5$ nm is need for 3V operation when the dielectric is silicon dioxide.

A suitable deposition technique for dielectric layer 22 would be, for example, atomic layer deposition ALD, high density plasma chemical vapor deposition HDCVD, low density plasma chemical vapor deposition LPCVD, etc., depending on the chosen materials. The process of depositing the electrode layers 20 and dielectric layers 22 proceeds until a desired number of serpentine plate capacitors 18 are created. The size of trench width 26 and the ratio between trench width 26 and ridge height 32 typically limits the number of electrode and dielectric layers 20, 22. The size of trench width 26 is usually greater than ridge width 30.

Figure 5:
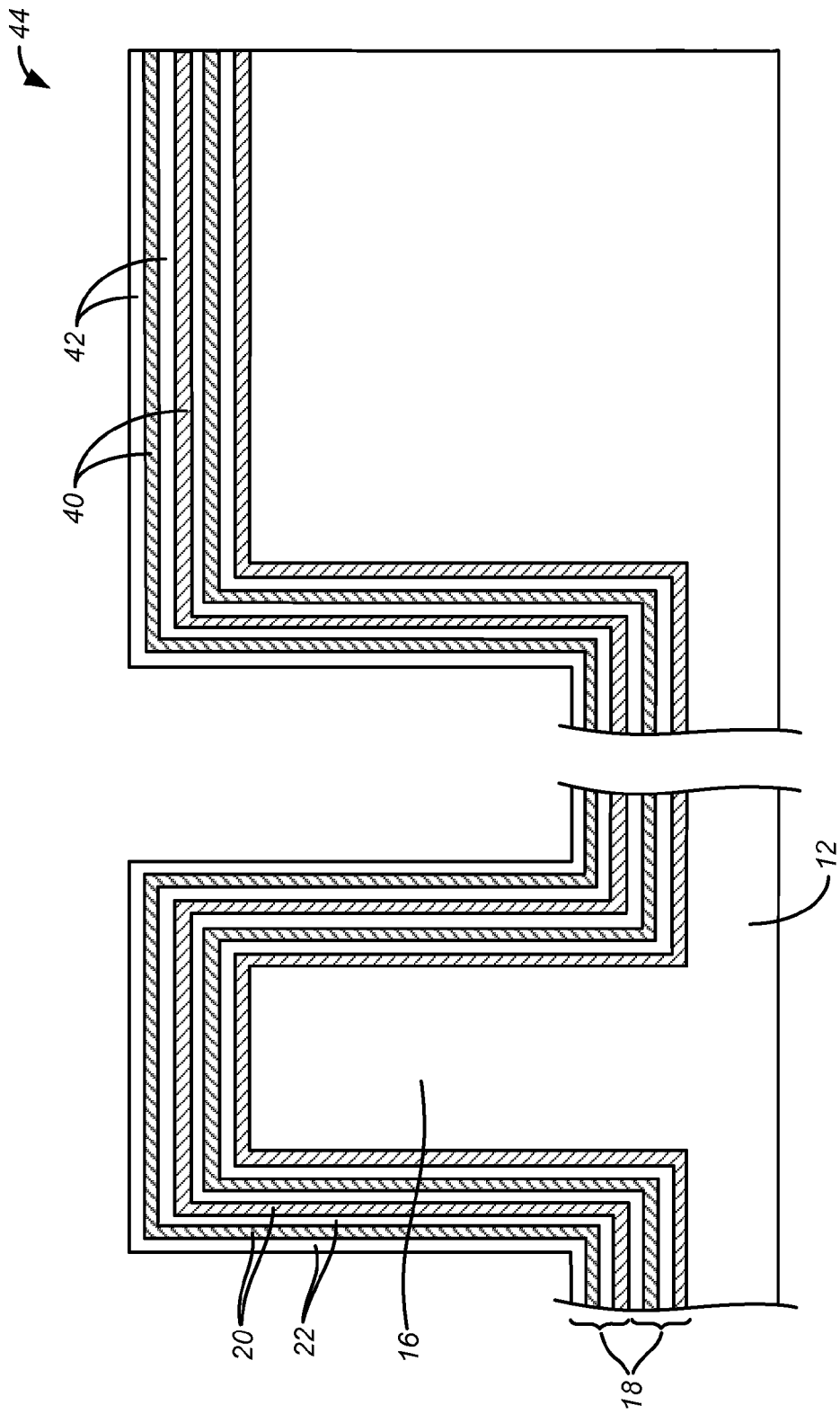
FIG. 5 shows the structure of FIG. 4 after deposition of four electrode layers and four dielectric layers creating a stack of serpentine plate capacitors with four electrode layer extensions and four dielectric layer extensions at an interconnect region.

FIG. 5 shows the structure of FIG. 4 after the deposition of four electrode layers 20 and four dielectric layers 22 creating a stack 17 of two serpentine plate capacitors 18. Electrode layers 20 and dielectric layers 22 can continue as electrode layer extensions 40 and dielectric layer extensions 42 to an interconnect region 44. In this example, electrode layer extensions 40 and dielectric layer extensions 42 at interconnect region 44 are the same height as the corresponding electrode layers 20 and dielectric layers 22 deposited on the top wall surfaces 25 of dielectric ridges 16. In other examples, such as when dielectric ridges 16 are not formed within a trench, electrode layer extensions 40 and dielectric layer extensions 42 at interconnect region 44 may be at the same height as the corresponding electrode layers 20 and dielectric layers 22 deposited on substrate surface 14. Interconnect region 44 could also be created at the top of one or more dielectric ridges 16 or at the bottom of one or more trenches 15 instead of at a separate interconnect region; in such case electrode layer extensions 40 would typically not be necessary.

In one example of the combined, total capacitance for an integrated circuit (IC) capacitor 10 with capacitors 18 connected in parallel was at least 10 pF. In this example, IC capacitor had 2 electrode layers 20 separated by dielectric layers 22 formed on 1000 ridges 16 having an average ridge width 30 of 200 nm, and average ridge height 32 of 2 µm, and average ridge length 36 of 2 µm, and an average trench widths 26 of 200 nm. The average thickness of the electrode layers 20 was 10 nm and the average thickness of dielectric layers 22 was 10 nm.

Figure 7:
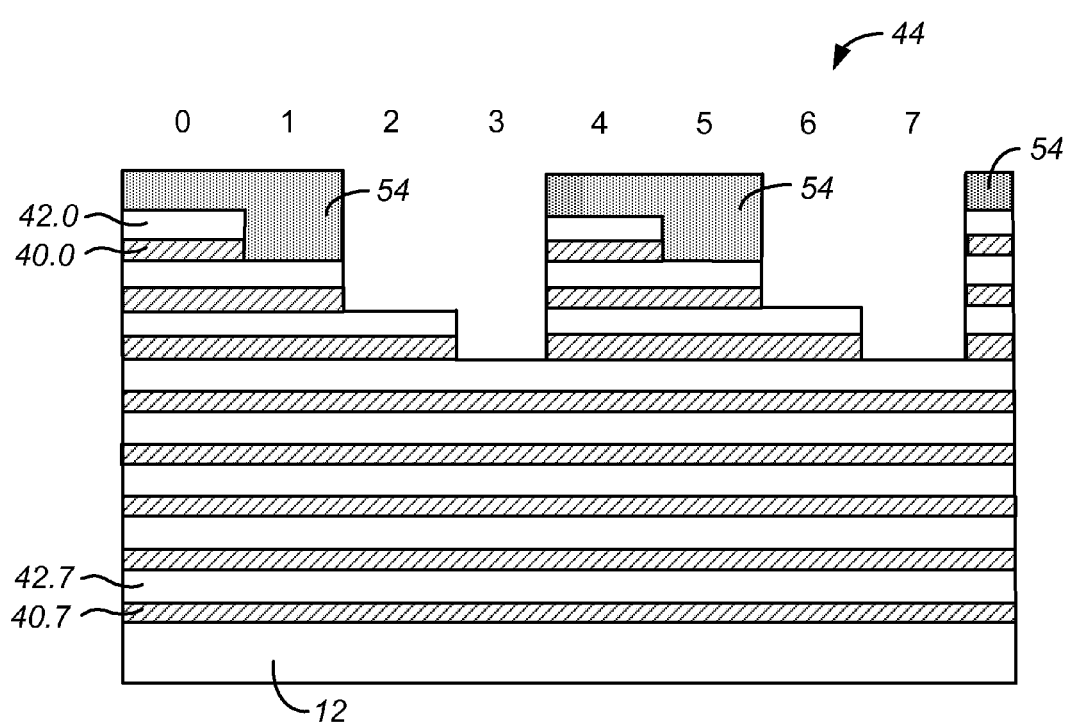
Figure 8:
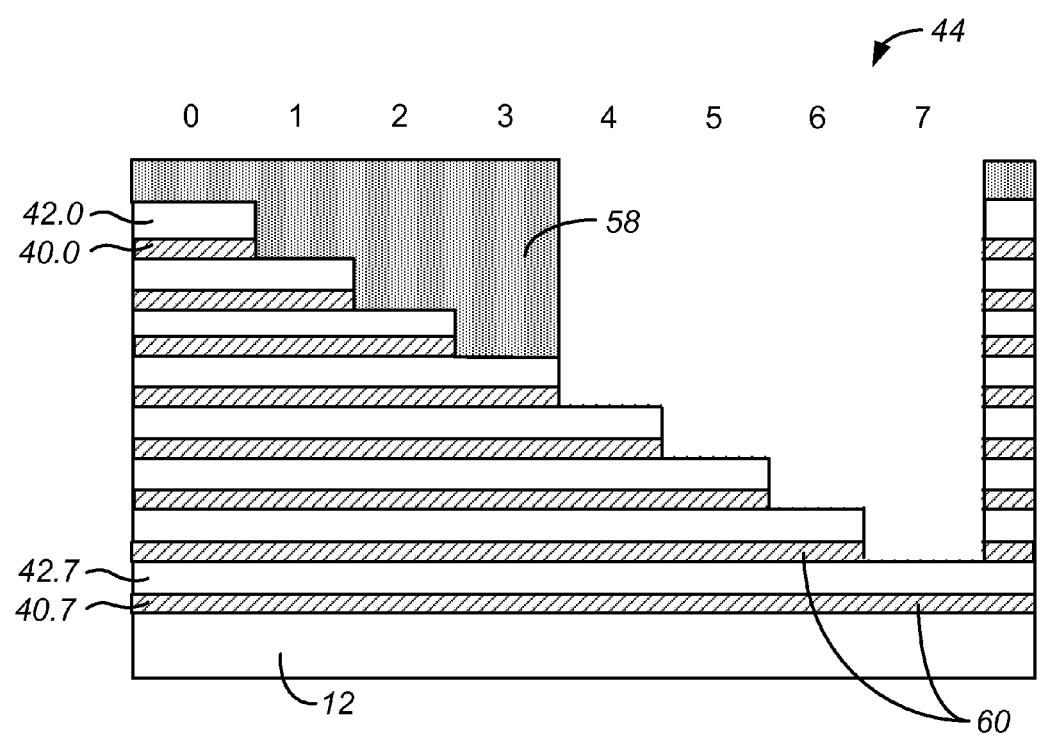
Figure 9:
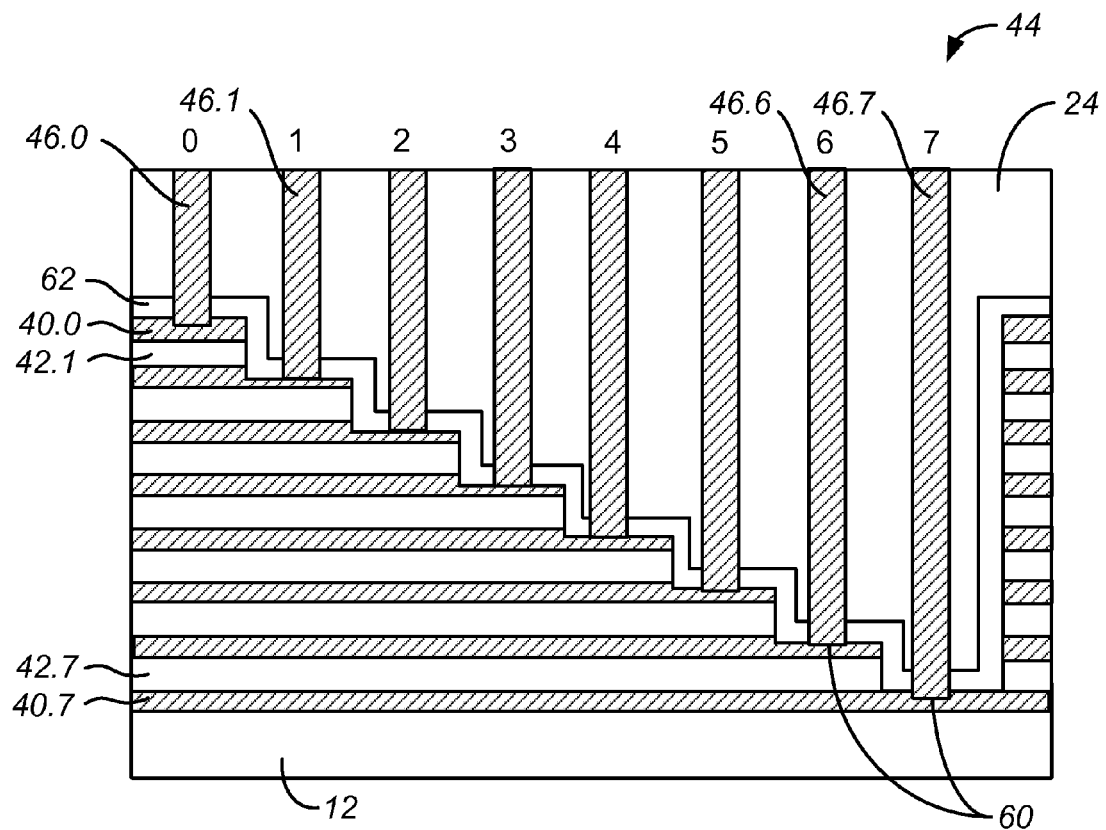

FIGS. 6-9 illustrate a sequence of steps creating electrical conductors 46, shown in FIG. 9, in contact with electrode layer extensions 40 at interconnect region 44 to provide electrical access to the serpentine plate capacitors 18 of serpentine, stacked plate capacitor assembly 17. In the example of FIGS. 1-5, four electrode layers 20 and four dielectric layers 22 are shown while in FIGS. 6-9 eight electrode layers 20 and eight dielectric layers 22 are shown to better illustrate the binary process for creating electrical conductors 46 to interconnect the serpentine plate electrodes among themselves and with other components on the integrated circuit. The different electrode layer extensions 40 are identified in the figures as electrode layer extensions 40.0 through 40.7 with the top most being 40.0. The locations for the electrical conductors 46 for contact with the corresponding electrode layer extensions 40 are labeled 0 through 7 in the figures. Similar numbering occurs with dielectric layer extensions 42. When an interconnect region 44 is located at the top of one or more dielectric ridges 16 or at the bottom of one or more trenches 15, then electrode conductors 46 will directly contact the electrode layers 20 with electrode layer extensions 40 being unnecessary. In the above-described examples, IC capacitor 10 is formed in a trench formed in a substrate which has the advantage of decreasing the height of the entire structure.

Figure 6:
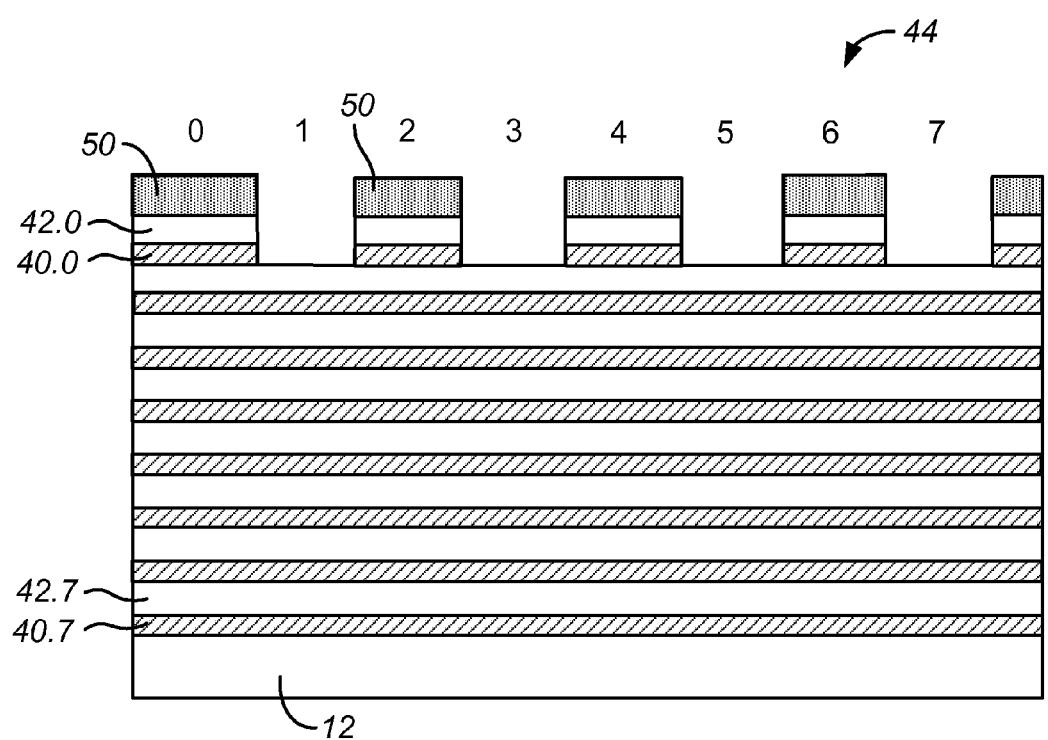
FIGS. 6-9 illustrate a sequence of steps creating electrical conductors at an interconnect region in contact with extensions of the electrode layers, such as shown in the example of FIG. 5, providing electrical access to a serpentine, stacked plate capacitor assembly.

A first photoresist mask 50, shown in FIG. 6, is created on dielectric layer extension 42.0 at electrical conductor locations 0, 2, 4, 6 and on the far side of location 7. The regions covered by photoresist masks are sometimes referred to as mask regions. The regions not covered by first photoresist mask 50, sometimes referred to as etch regions, are then etched one level through dielectric layer extension 42.0 and electrode layer extension 40.0 to create the structure shown in FIG. 6. Next, as shown in FIG. 7, first photoresist mask 50 is removed and then a second photoresist mask 54 is formed on the resulting structure of FIG. 6 to cover electrical conductor locations 0, 1, 3, 4 and following 7. The structure is then etched two levels at the exposed regions to create the structure shown in FIG. 7. Next, second photoresist mask 54 is removed and a third photoresist mask 58 is formed to cover electrical conductor locations 0, 1, 2, 3 and following 7. The exposed portions of the structure are then etched four levels to create the structure shown in FIG. 8.

Thereafter, third photoresist mask 58 is removed and an optional conformal dielectric barrier layer material can be deposited on the exposed surfaces, including over the stair stepped landing pads 60, to create a dielectric barrier layer 62. Barrier layer 62 is used as an etching stop and is can be made of silicon nitride. Dielectric fill layer 24 is deposited on the resulting structure. Appropriate vias are then formed through dielectric fill layer 24 and through the dielectric barrier layer 62 covering the landing pad 60 of each of electrode layer extensions 40.0-40.7. Electrical conductors 46 are then formed in the vias to provide electrical connection with landing pads 60 of electrode layer extensions 40 and thus with electrode layers 20 of serpentine plate capacitors 18. Electrical conductors 46 can be made of the same electrical conductor materials discussed above. However, doped Si, W and Cu may be preferred because of the existing knowledge about chemical mechanical polishing of these electrically conductive materials. Electrical conductors 46 are identified as 46.0-46.7 corresponding to locations 0-7.

More than one interconnect region 44 could be used to access the landing pads 60 at the various levels. Some or all of the landing pads 60 at the different levels could be accessed by the same or different interconnect region 44.

The process for creating electrical conductors 46 can be referred to as a binary process, based on $2^0 \ldots 2^{n-1}$ with n being the number of etching steps. That is, first photoresist mask 50 alternatingly covers $2^0$ landing pads 60 and exposes $2^0$ landing pads 60; second photoresist mask 54 alternatingly covers $2^1$ landing pads 60 and exposes $2^1$ landing pads 60; third photoresist mask 58 alternatingly covers $2^2$ landing pads 60 and exposes $2^2$ landing pads 60; and so on. Using this binary process, n masks can be used to provide access to $2^n$ landing pads 60 for $2^n$ electrode conductors 46. Thus, using three masks provides access to 8 landing pads 60 for 8 electrode conductors 46. Using five masks would provide access to 32 landing pads 60 by 32 electrical conductors 46. The order of etching need not be in the order of n−1=0, 1, 2, .... For example, the first etching step could be with n−1=2, the second could be with n−1=0, and the third could be with n−1=1. The result will be the same structure as shown in FIG. 8.

Further information on similar techniques and methods for connecting electrical conductors 46 to landing pads 60 are disclosed in U.S. patent application Ser. No. 13/049,303, filed 16 Mar. 2011, entitled REDUCED NUMBER OF MASK FOR IC DEVICE WITH STACKED CONTACT LEVELS; and in U.S. patent application Ser. No. 13/114,931, filed 24 May 2011, entitled MULTILAYER CONNECTION STRUCTURE AND MAKING METHOD, the disclosures of which are incorporated by reference. These two applications and the present application have a common assignee.

Figure 12:
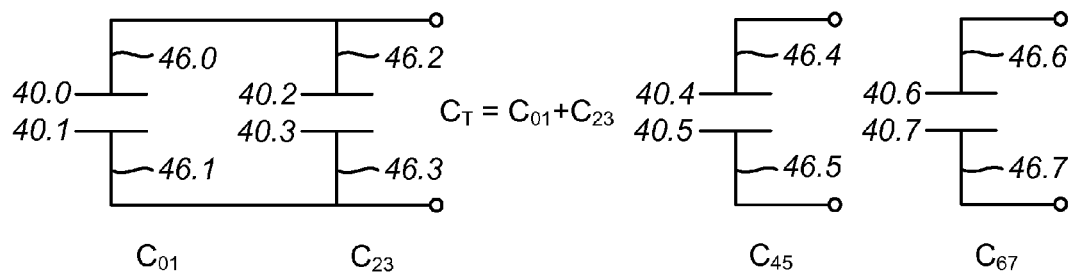
FIGS. 12 and 12A show an example in which two of the capacitors are connected in parallel with the other two capacitors remaining as separate capacitors.
Figure 12A:
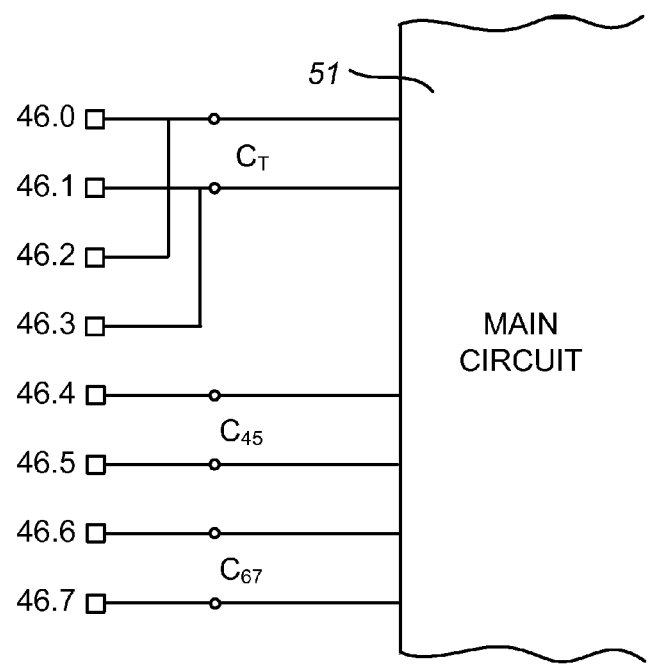
Figure 13:
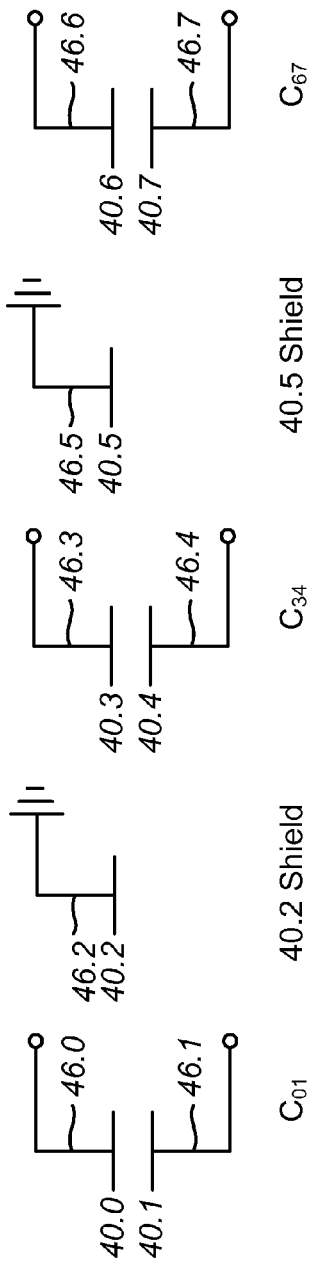
FIG. 13 schematically illustrates connecting two of the electrical conductors to ground to provide shielding between adjacent capacitors.

The example of FIG. 9 has four serpentine plate capacitors 18 connected to electrical conductors 46.0 and 46.1, 46.2 and 46.3, 46.4 and 46.5, and 46.6 and 46.7. To make one large-capacitance capacitor, the individual capacitors, identified as $C_{01}$, $C_{23}$, $C_{45}$ and $C_{67}$ in FIG. 10, can be placed in parallel. To do so, electrical conductors 46.0, 46.2, 46.4 and 46.6 are shorted to one another as a first electrode 47 and electrical conductors 46.1, 46.3, 46.5 and 46.7 are shorted to one another as a second electrode 48. Another example, shown in FIG. 11, shows each of capacitors $C_{01}$, $C_{23}$, $C_{45}$ and $C_{67}$ connected in series. While the total capacitance $C_T$ for the FIG. 11 example is less than the capacitance of any of the individual capacitors, placing the capacitors in series is useful when working with high voltages because each capacitor only sees a fraction of the total voltage. FIGS. 12 and 12A show capacitors $C_{01}$ and $C_{23}$ connected in parallel and capacitors $C_{45}$ and $C_{67}$ as separate capacitors. FIG. 12A schematically shows the connection between electrical conductors 46.0-46.7 and main circuit 51 for the arrangement of FIG. 12. A further example is shown in FIG. 13; in this example electrical conductors 46.2 and 46.5 are connected to ground so that the electrode layers 20 and electrode layer extensions 40 connected to electrical conductors 46.2 and 46.5 act as shielding between capacitors $C_{01}$ and $C_{34}$, and between capacitors $C_{34}$ and $C_{67}$.

Figure 15:
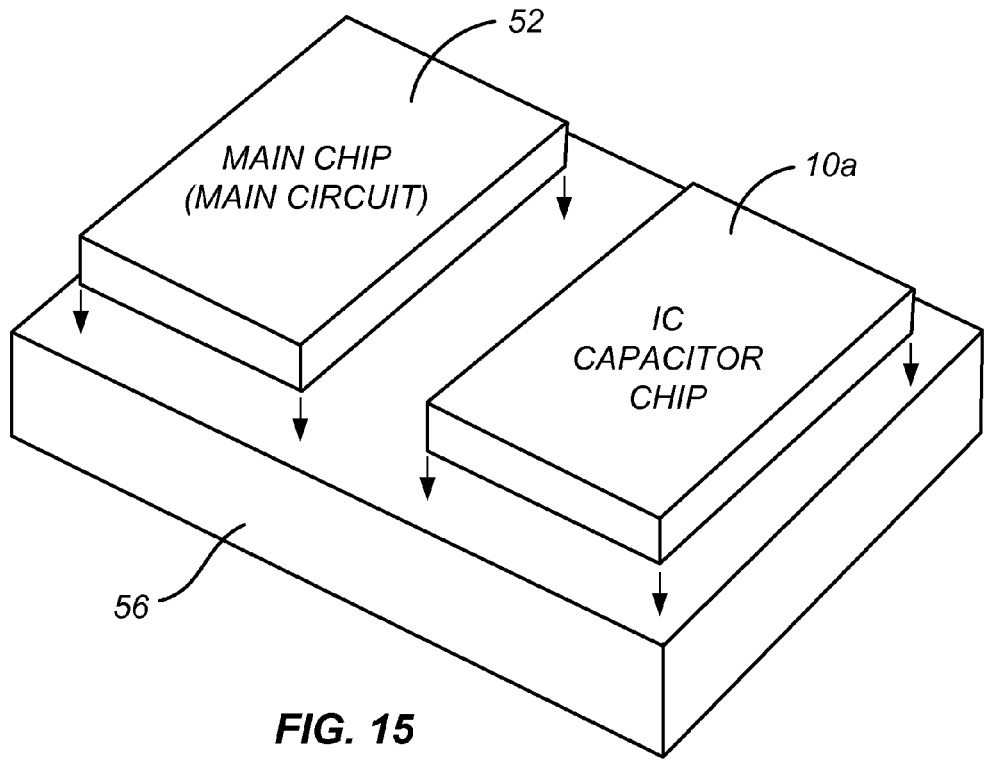
FIG. 15 is a simplified view of an off-chip design in which a main chip and a relatively large IC capacitor chip are mounted to a common substrate.
Figure 16:
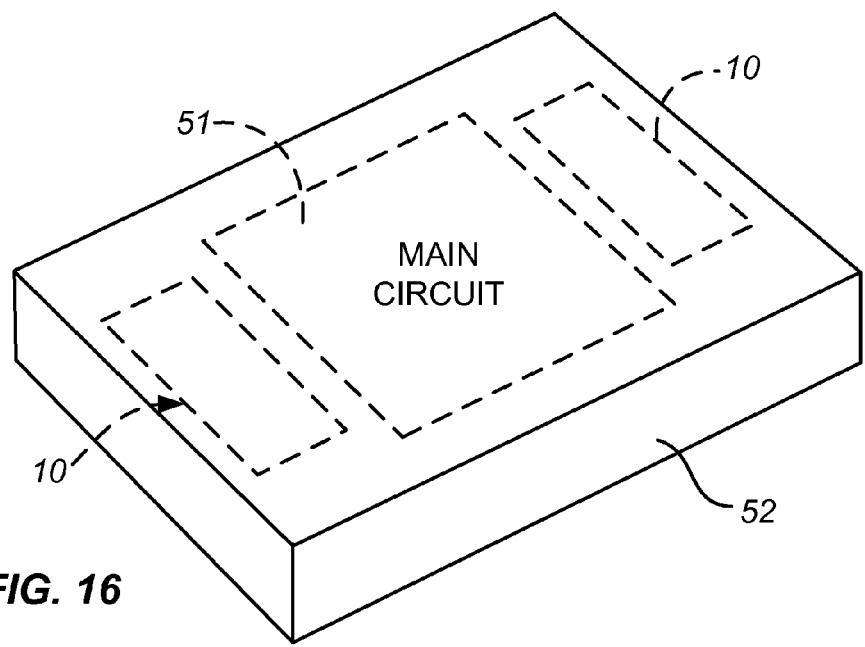
FIG. 16 is a simplified view showing a main circuit and multiple, smaller IC capacitors embedded within a multi-layer chip.
Figure 17:
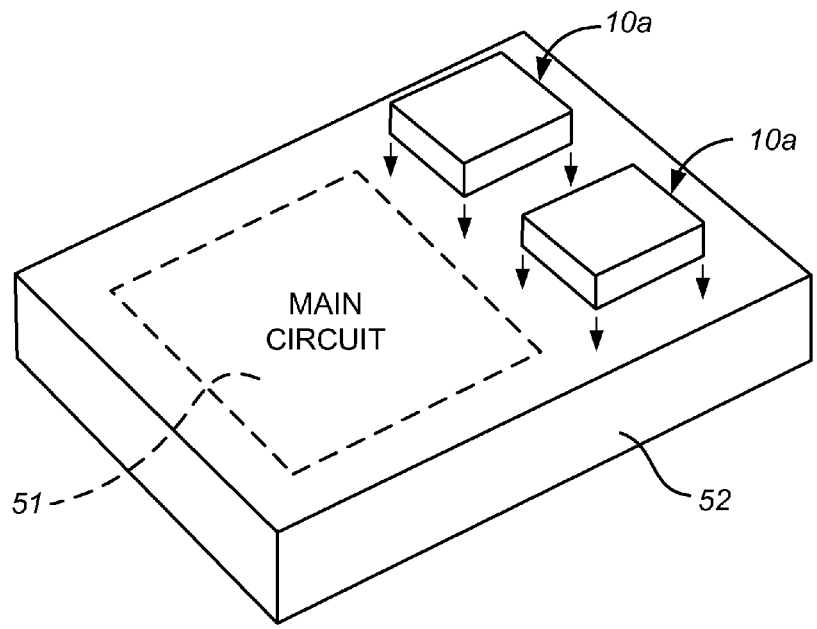
FIG. 17 is a simplified view showing a main circuit embedded within a main, multi-layer chip and multiple, smaller IC capacitor chips mounted to the main, multi-layer chip.
Figure 18:
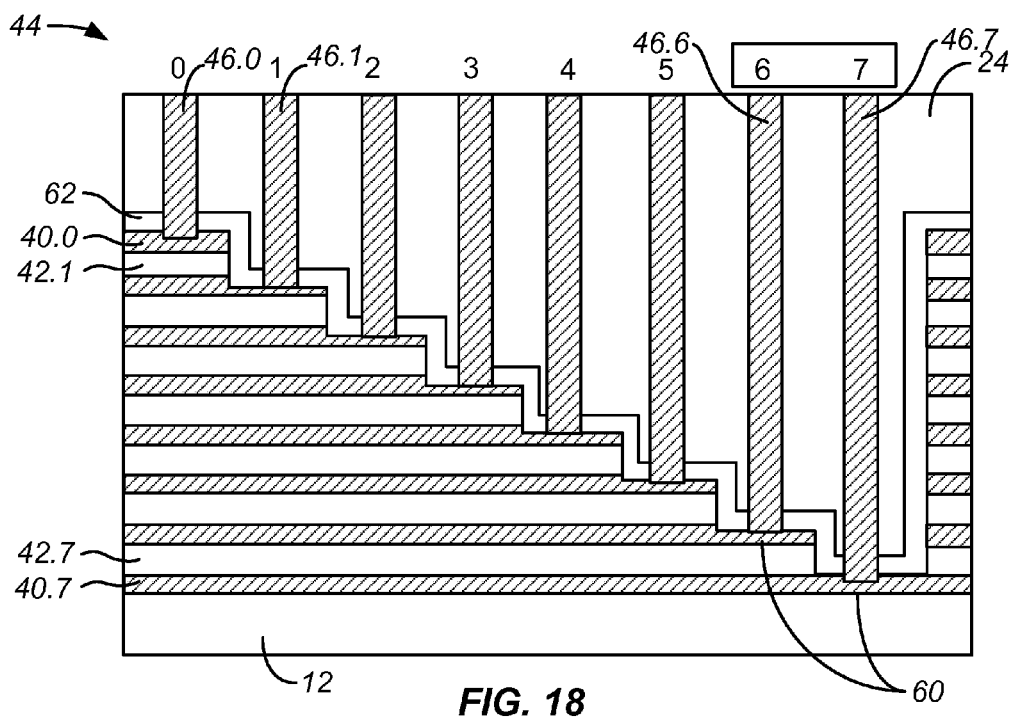
FIG. 18 suggests that after testing, individual serpentine plate capacitors can be tested, and if necessary have the nominal capacitance for a particular serpentine plate capacitor changed to reflect its actual capacitance.

IC capacitor 10 can be used in a wide variety of situations. For example, a larger, higher capacitance capacitor could be used as a power buffer. This kind of design is useful to reduce power stability issues by damping fluctuations in the power supply voltage, making it more stable. An IC capacitor 10 designed for use as a power buffer may be about the same size as the main circuit 51; see FIGS. 14 and 15. In some cases, as illustrated in FIG. 15, the main circuit may be a part of a main chip 52 and the IC capacitor may be part of a separate IC capacitor chip 10a, both mounted to a common substrate 56. However, yield concerns can result in the choice of two or more smaller IC capacitors 10 instead of one large IC capacitor as shown in FIGS. 16 and 17. IC capacitor 10 can also be a relatively small capacitor for other purposes, for example as a DRAM capacitor.

Figure 14:
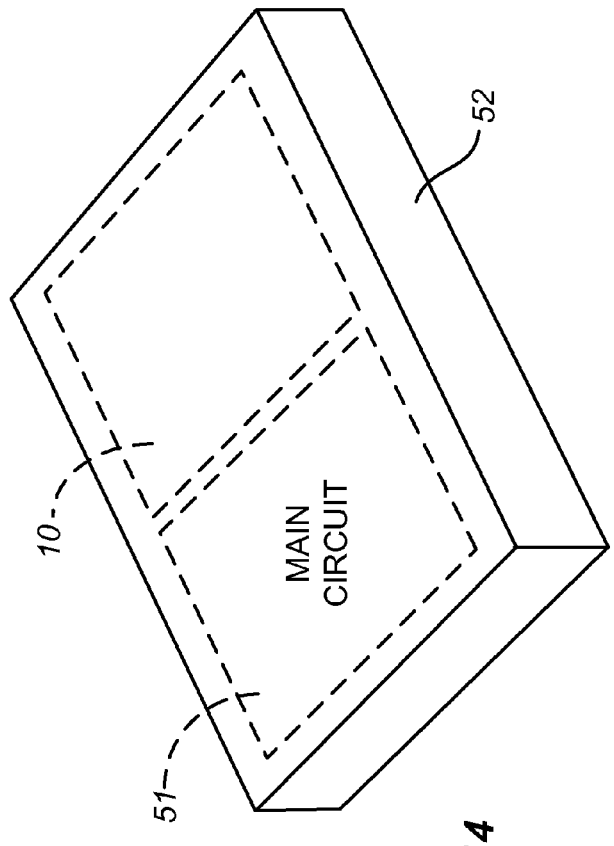
FIG. 14 is a simplified view showing a main circuit and a single, relatively large IC capacitor, both embedded within a multi-layer chip.

IC capacitor 10 can be designed to be embedded within a multi-layer chip as suggested in FIGS. 14 and 16. IC capacitor 10 can also be an off-chip design so that only the capacitor would be part of the chip. Such an IC capacitor chip 10a, see FIGS. 15 and 17, can be mounted in a multichip carrier or multichip stack with chip 10a connected to components of the main circuit by, for example, wire-bonding, flip-chip (face to face mount) mounting, or through silicon via connections TSV.

Figure 19:
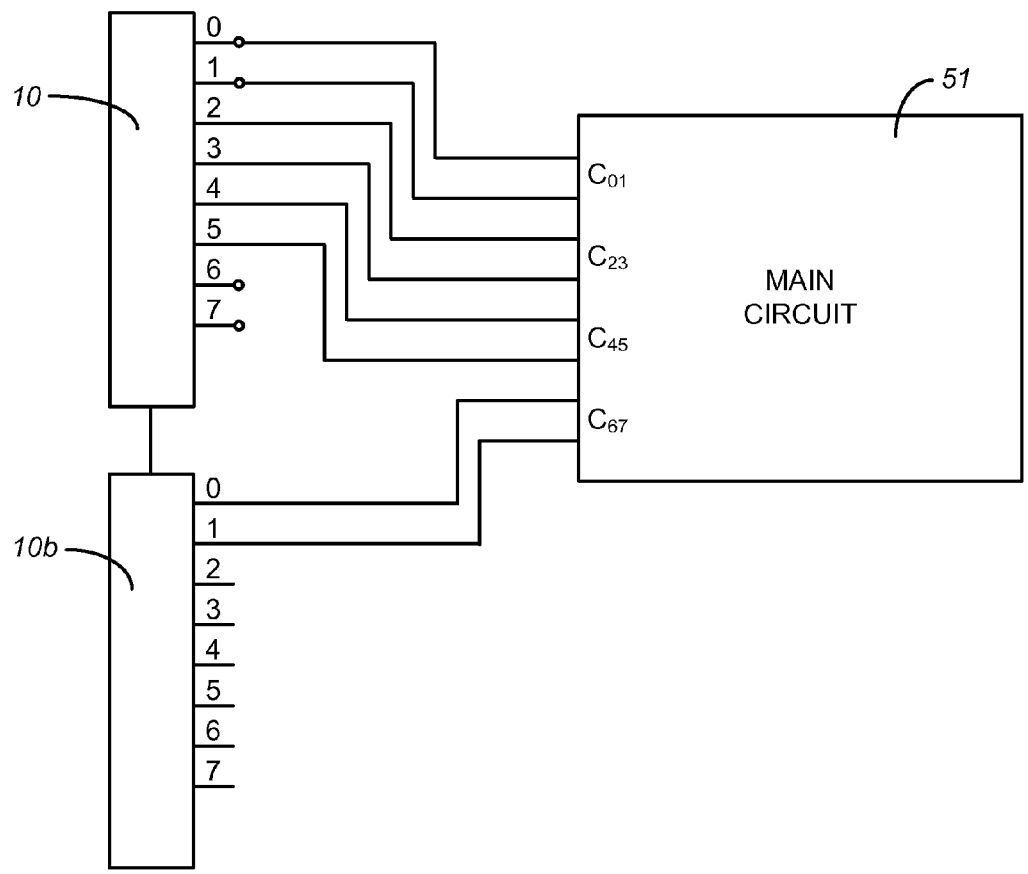
FIGS. 19 and 20 suggest the use of a redundancy IC capacitor in addition to one or more IC capacitors so that if a capacitor is found defective, a capacitor in the redundancy IC capacitor could be used to replace the defective capacitor.
Figure 20:
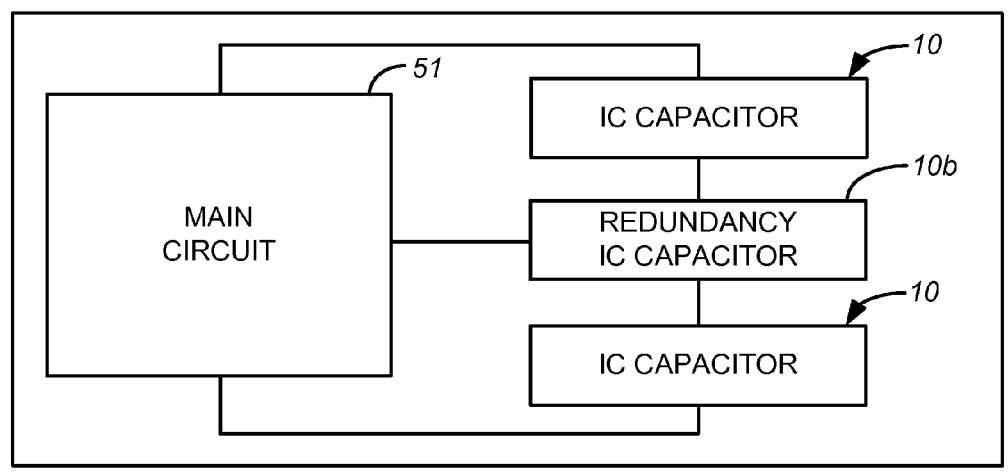

After testing, a particular serpentine plate capacitor 18 may be found to deviate from the nominal capacitance. For example, after testing the serpentine plate capacitor 18 created between electrical conductors 46.6 and 46.7, $C_{67}$, was found to have, a capacitance of 7.5 pF instead of a design capacitance of 10 pF. Electrical conductor locations 6 and 7 corresponding to electrode layer extensions 40.7 and 40.6 are placed within a box indicating that the capacitor formed by the associated electrode layers is the one not meeting specifications. The capacitance for that serpentine plate capacitor 18, $C_{67}$, can therefore be downgraded to 7.5 pF. If, however, capacitor $C_{67}$ is considered defective, it would then be marked as a bad capacitor and not used. However, the downgraded IC capacitor 10 with the bad capacitor could also be used as a separate IC capacitor chip 10a such as shown in FIGS. 15 and 17. Alternatively, the defective capacitor could be repaired in a manner similar to memory error function. One way of doing this would be to address the connection from the defective capacitor to a separate capacitor in a set of redundancy capacitors created by, for example, the redundancy IC capacitor 10b as shown in FIGS. 19 and 20. Redundancy IC capacitor 10b could be in the form of a separately mounted IC capacitor chip 10a as suggested in FIG. 17 or as an embedded IC capacitor 10 as suggested in FIG. 16. Control circuitry, typically a part of main circuit 51, would control this re-addressing function. This can be done in a conventional manner by use of laser cut, or E-fuse, or embedded flash (non-volatile memory, resistive random access memory) code.

Figure 21:
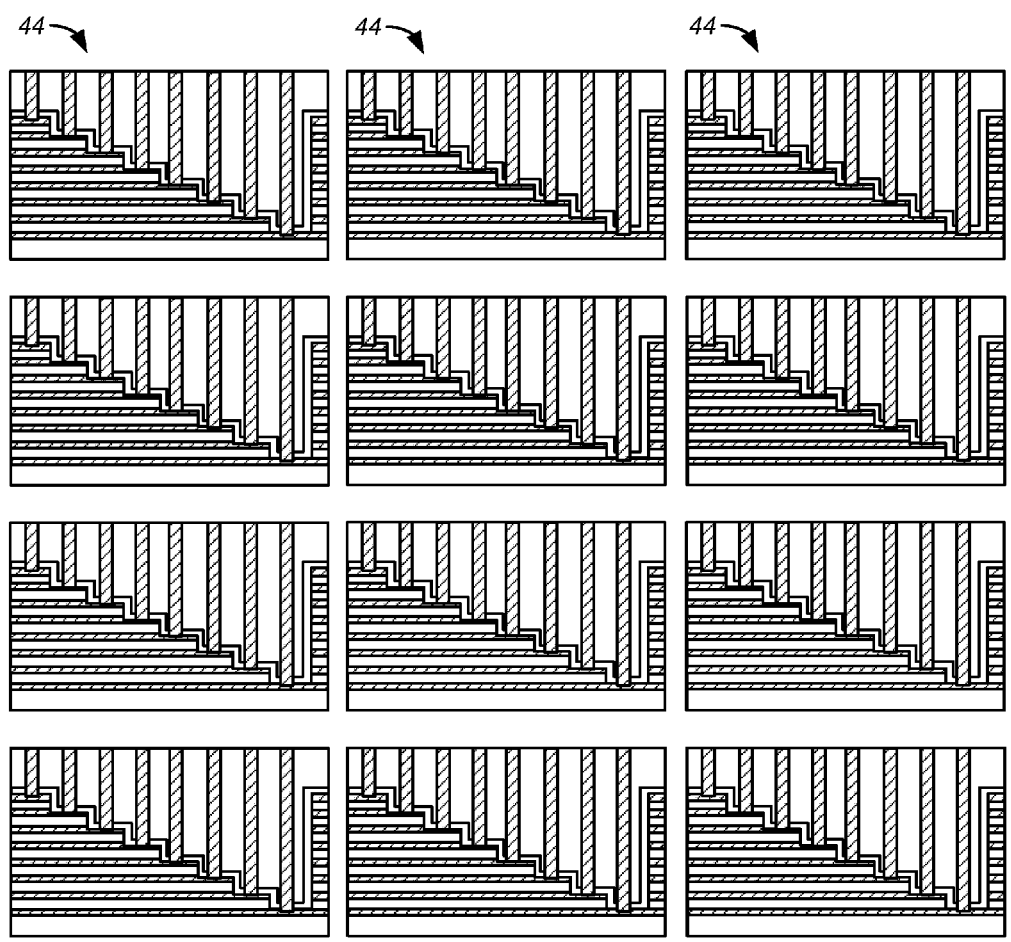
FIG. 21 suggests creating a plurality of IC capacitors in the same area that one IC capacitor could otherwise be made to minimize the amount of damage a defect would have.

Instead of making one IC capacitor 10 within a surface area, a number of different IC capacitor 10 could be created in the same surface area so that any defective capacitors would reduce the amount of damage anyone defect would have. This is suggested in FIG. 21. Of course doing this would need to be balanced against the possibility that increasing the number of IC capacitors 10 may also increase the frequency of defects.

With some semiconductor devices the distance between the physical location on the chip wherein a voltage is applied and the location or locations where that voltage is used may be a significant distance. The distance may be great enough that the resistance between the application point and the use point or points may be sufficiently great to materially affect the voltage at the point of use. The distance may also be great enough to create a significant time delay between application of the voltage at the application point and receipt of the voltage at the use point. To help reduce these effects, a plurality of interconnect regions 44 for the same set of serpentine capacitors 18 could be formed on the same chip to surround the operational device or devices. Doing so would permit a voltage to be simultaneously applied to different positions on the same electrode layer 20 or on different electrode layers 20. Doing so minimizes the differences in the voltage at different use points and also minimizes the time required for the voltage to be applied to the entire electrode layer.

The above descriptions may have used terms such as above, below, top, bottom, over, under, et cetera. These terms may be used in the description and claims to aid understanding of the invention and not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims. For example, FIG. 1 illustrates a portion of trench width 26 being filled with dielectric fill layer 24; in other examples, the entire trench width 26 is filled with electrode and dielectric layers 20, 22.

Any and all patents, patent applications and printed publications referred to above are incorporated by reference.

What is claimed is:

1. A capacitor comprising:
a substrate having a capacitor region and an interconnect region;
a series of ridges and trenches at the capacitor region;
the interconnect region located laterally from the capacitor region;
the interconnect region and the capacitor region having a capacitor foundation surface;
the capacitor foundation surface having a serpentine cross-sectional shape on the series of ridges and trenches at the capacitor region;
a serpentine, stacked plate capacitor assembly, comprising at least two electrically conductive electrode layers and dielectric layers separating the electrode layers, at the capacitor foundation surface of the capacitor region, the serpentine, stacked plate capacitor assembly creating a stack of one or more capacitors; and
electrical conductors at the interconnect region electrically connected to the electrode layers for access to the electrode layers of the capacitor assembly.

2. The capacitor according to claim 1, wherein the capacitor foundation surface is electrically conductive and constitutes an electrode layer.

3. The capacitor according to claim 1, wherein the interconnect region in spaced apart from the series of ridges and trenches.

4. The capacitor according to claim 1, wherein the electrical conductors pass through vertical vias in the interconnect region, the vertical vias overlying landing pads of the electrode layers, the electrical conductors electrically connected to the landing pads.

5. The capacitor according to claim 4, wherein each electrical conductor is electrically connected to one landing pad of one electrode layer.

6. The capacitor according to claim 4, wherein the landing pads to which the electrical conductors are electrically connected are arranged in a stair stepped arrangement.

7. The capacitor according to claim 1, wherein the series of ridges are located above and extend away from the substrate.

8. The capacitor according to claim 1, wherein some but not all of the capacitors are connected in parallel.

9. The capacitor according to claim 1, wherein:
the ridges have ridge widths, the trenches have trenches widths, the ridge widths and the trench widths extending in a first direction;
the ridges have ridge heights extending in a second direction, the second direction being perpendicular to the first direction;
the ridges have ridge lengths measured in a third direction, the third direction being perpendicular to the first and second directions;
the ridges have sidewall surfaces extending in the second and third directions;
the ridges have top wall surfaces extending in the first and third direction; and
the substrate comprises a substrate surface extending in the first and third direction.

10. A capacitor comprising:
a substrate having a capacitor region and an interconnect region;
a series of ridges and trenches at the capacitor region;
the interconnect region located laterally from the capacitor region;
the interconnect region and the capacitor region having a capacitor foundation surface;
the capacitor foundation surface having a serpentine cross-sectional shape on the series of ridges and trenches at the capacitor region;
a serpentine, stacked plate capacitor assembly, comprising at least two electrically conductive electrode layers and dielectric layers separating the electrode layers, at the capacitor foundation surface of the capacitor region, the serpentine, stacked plate capacitor assembly creating a stack of one or more capacitors;
the interconnect region having landing pads;
electrical conductors contacting the landing pads at the interconnect region electrically connected to the electrode layers for access to the electrode layers of the capacitor assembly; and
at least an additional one of the ridges or trenches constituting the interconnect region with the landing pads being located as follows:
when the additional one is an additional trench, the landing pads are located at the bottom of the additional trench; and
when the additional one is an additional ridge, the landing pads are located at the top of the additional ridge.

11. A capacitor comprising:
a substrate having a first trench, a capacitor region located within the first trench, and an interconnect region;
a series of ridges located within the first trench at the capacitor region, the ridges separated by second trenches;
the interconnect region located laterally from the capacitor region;
the interconnect region and the capacitor region having a capacitor foundation surface;
the capacitor foundation surface having a serpentine cross-sectional shape on the series of ridges and second trenches at the capacitor region within the first trench;
a serpentine, stacked plate capacitor assembly, comprising at least two electrically conductive electrode layers and dielectric layers separating the electrode layers, at the capacitor foundation surface of the capacitor region, the serpentine, stacked plate capacitor assembly creating a stack of one or more capacitors; and
electrical conductors at the interconnect region electrically connected to the electrode layers for access to the electrode layers of the capacitor assembly.

\* \* \* \* \*